United States Patent
Okura et al.

(10) Patent No.: US 6,860,982 B2
(45) Date of Patent: Mar. 1, 2005

(54) ZINC OXIDE WITH ACICULAR STRUCTURE, PROCESS FOR ITS PRODUCTION, AND PHOTOELECTRIC CONVERSION DEVICE

(75) Inventors: Hiroshi Okura, Kanagawa (JP); Tohru Den, Tokyo (JP); Kaoru Konakahara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 403 days.

(21) Appl. No.: 10/101,462

(22) Filed: Mar. 20, 2002

(65) Prior Publication Data

US 2002/0139688 A1 Oct. 3, 2002

(30) Foreign Application Priority Data

Mar. 22, 2001 (JP) ........................................ 2001-082992
Mar. 18, 2002 (JP) ........................................ 2002-073731

(51) Int. Cl.$^7$ ................................................. C25D 9/04

(52) U.S. Cl. ....................................... 205/333; 205/316

(58) Field of Search ................................ 205/333, 316; 204/290.01; 136/256, 265

(56) References Cited

U.S. PATENT DOCUMENTS

| | | | |
|---|---|---|---|
| 5,066,475 A | 11/1991 | Yoshinaka et al. .......... | 423/622 |
| 5,279,809 A | 1/1994 | Kitano et al. ............... | 423/622 |
| 5,350,644 A | 9/1994 | Graetzel et al. ............. | 429/111 |
| 5,804,466 A * | 9/1998 | Arao et al. ................... | 438/95 |
| 6,214,738 B1 | 4/2001 | Aiba et al. .................. | 438/707 |
| 6,228,502 B1 | 5/2001 | Saitoh et al. ............... | 428/472 |
| 6,270,571 B1 | 8/2001 | Iwasaki et al. ............... | 117/88 |
| 6,649,824 B1 * | 11/2003 | Den et al. .................... | 136/256 |
| 2002/0014621 A1 | 2/2002 | Den et al. ....................... | 257/3 |
| 2002/0037249 A1 | 3/2002 | Konakahara et al. ........ | 423/592 |

FOREIGN PATENT DOCUMENTS

| | | |
|---|---|---|
| JP | 50-6597 | 1/1975 |
| JP | 56-120518 | 9/1981 |
| JP | 1-252600 | 10/1989 |
| JP | 8-217443 | 8/1996 |
| JP | 8-239300 | 9/1996 |
| JP | 8-260175 | 10/1996 |
| JP | 10-316428 | 12/1998 |

OTHER PUBLICATIONS

*Metal*, 89–93, (Feb. 1991) as Translated by Hiroshi Iwanaga et al. "A Note on the Orientation of ZnO Ribbon Crystal," 11 *Jpn. J. Appl. Phys.* 121–122 (1972), no month.

Minoru Satoh et al., "Epitaxial Growth of Zinc Oxide Whiskers by Chemical–Vapor Deposition Under Atmospheric Pressure," 38 *Jpn. J. Appl. Phys.* L586–589 (1999), no month.

Motoi Kitano et al., "Growth of Large Tetrapod–Like ZnO Crystals: Experimental Conditions on Kinetics of Growth," 102 *Jpn. J. Crystl. Growth* 965–973 (1990), no month.

(List continued on next page.)

*Primary Examiner*—Arun S. Phasge
(74) *Attorney, Agent, or Firm*—Fitzpatrick, Cella, Harper & Scinto

(57) ABSTRACT

A process for producing a zinc oxide acicular structure by growing an acicular zinc oxide on a substrate, the process comprising the steps of holding the substrate in an electrolytic solution in which at least zinc ions are present, and forming zinc oxide on the substrate by electrodeposition. The electrolytic solution contains at least one cosolute. Also disclosed is a photoelectric conversion device comprising a charge transport layer having the zinc oxide acicular structure.

9 Claims, 6 Drawing Sheets

OTHER PUBLICATIONS

Tsukasa Yoshida et al., "Self-Assembly of Zinc Oxide Thin Films Modified with Tetrasulfonated Metallophthalocyanes by One-Step Electrodeposition," 11 *Chem. Mater.* 2657–2667 (1999), no month.

Masanobu Izaki et al., "Preparation of Transparent and Conductive Zinc Oxide Films by Optimization of the Two-Step Electrolysis Technique," 146 (12) *J. Electrochem. Soc.* 4517–4521 (1999), no month.

Masanobu Izaki et al., *Appl. Phys. Lett.*, 68(17):2439–2440 (1996), no month.

M.K. Nazeeruddin et al., "Conversion of Light to Electricity by cis-$X_2$Bis(2,2'-bipyridyl-4,4'-dicarboxylate)ruthenium(II) Charge-Transfer Sensitizers (X=Cl$^-$, Br$^-$, I$^-$, CN$^-$, and SCN) on Nanocrystalline $TiO_2$ Electrodes," 115 *J. Am. Chem. Soc.* 6382–6390 (1993), no month.

Brian O'Regan et al., "Electrodeposited n–p Heterojunctions for Solid–State Dye–Sensitized Photovoltaics," 12(17) *Adv. Mater.* 1263–1267 (2000), no month.

Zheng Wei Pan et al., "Nanobelts of Semiconducting Oxides," 291 *Science* 1947–1949 (2001), no month.

* cited by examiner

ZINC OXIDE WITH ACICULAR STRUCTURE, PROCESS FOR ITS PRODUCTION, AND PHOTOELECTRIC CONVERSION DEVICE

BACKGROUND OF THE INVENTION

1. Field of the Invention

This invention relates to a zinc oxide with acicular structure (zinc oxide acicular structure), a process for its production and a photoelectric conversion device.

2. Related Background Art

ZnO having attracted notice as a substance having various uses has been used in pigments, coating materials, printing inks, cosmetics, pharmaceuticals, dental materials and so forth from old times. In recent years, it is used in a wide field including electrophotographic photosensitive agents, semiconductor lasers, UV-screening agents, photocatalysts, sensors, surface elastic-wave filters, camera exposure meters, photoelectric conversion devices and so forth, utilizing semiconductivity, photo-semiconductivity, piezoelectric properties, light-emitting properties and interfacial properties.

As commonly available means for producing zinc oxide films, the films can be produced by various processes such as sputtering, vacuum deposition, CVD (chemical vapor deposition) and electrodeposition. For example, Japanese Patent Applications Laid-Open No. 8-217443 and No. 8-260175 disclose that a process has been established by which zinc oxide can uniformly be produced in a filmy form on a large-area conductive substrate by electrodeposition.

However, with regard to the process of forming zinc oxide by electrodeposition as disclosed in the above Japanese Patent Applications Laid-Open No. 8-217443 and No. 8-260175, the zinc oxide can only be formed in the filmy form, and not in an acicular form.

SUMMARY OF THE INVENTION

Accordingly, an object of the present invention is to provide a process of forming a zinc oxide acicular structure on a substrate, and provide the zinc oxide acicular structure. Another object of the present invention is to provide devices such as a photoelectric conversion device which makes use of such a zinc oxide acicular structure.

The present invention is a process for producing a zinc oxide acicular structure by growing an acicular zinc oxide on a substrate; the process comprising the steps of holding the substrate in an electrolytic solution in which at least zinc ions are present, and electro-depositing zinc oxide on the substrate; the electrolytic solution containing at least one cosolute.

The process for producing a zinc oxide acicular structure of the present invention is also a process for producing a zinc oxide acicular structure, comprising electro-depositing zinc oxide in an electrolytic solution in which at least zinc ions are present, to grow an acicular zinc oxide on a conductive substrate; the electrolytic solution comprising an electrolyte mingled with a zinc-containing salt and in addition thereto at least one cosolute.

The photoelectric conversion device of the present invention is a photoelectric conversion device having at least an electron acceptor type charge transporting layer, an electron donor type charge transporting layer and a light-absorbing layer provided between these charge transporting layers; the electron acceptor type charge transporting layer comprising a zinc oxide acicular structure, and the zinc oxide acicular structure having been formed by electrodeposition on a conductive substrate in an electrolytic solution in which at least zinc ions and at least one cosolute are present.

In the present invention, the cosolute may preferably be an alcohol. The cosolute may also preferably be a salt of a halide. The cosolute may still also preferably be a monomer or a polymer thereof.

The photoelectric conversion device of the present invention is also a photoelectric conversion device having at least an electron acceptor type charge transporting layer, an electron donor type charge transporting layer and a light-absorbing layer provided between these charge transporting layers; the electron acceptor type charge transporting layer having a zinc oxide acicular structure formed by electrodeposition on a conductive substrate under application of a potential, in an electrolytic solution in which at least zinc ions and at least one cosolute are present.

Here, the cosolute may preferably be an alcohol, a salt of a halide, a monomer or a polymer thereof, or a surface-active agent.

DESCRIPTION OF THE PREFERRED EMBODIMENTS

First Category: Production Process

Figure 5:
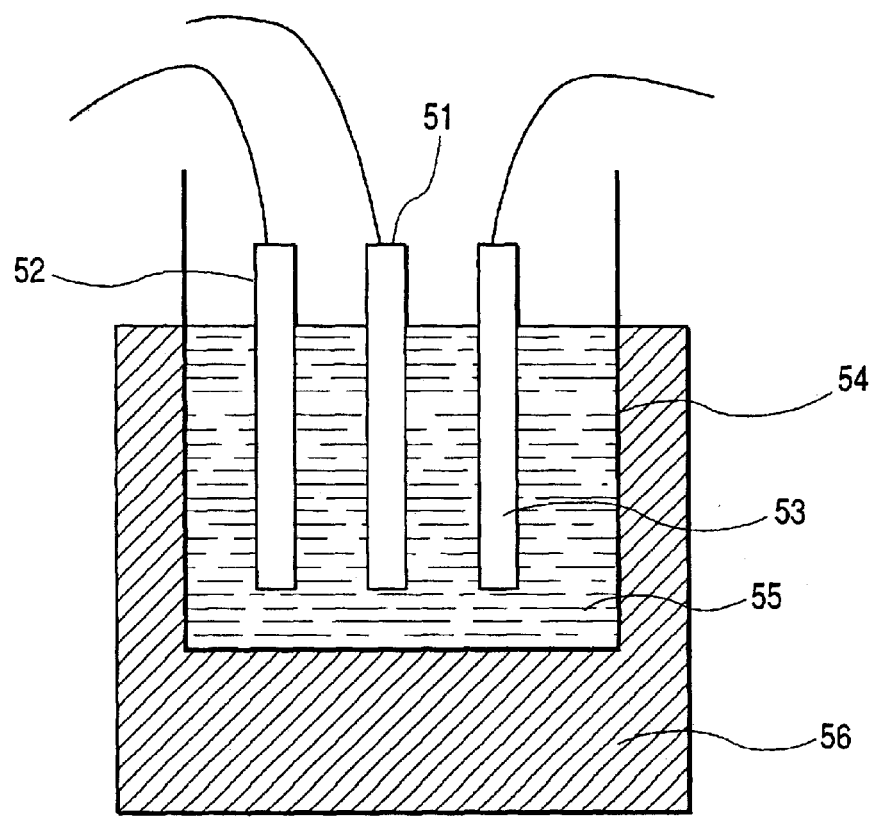
FIG. 5 is a schematic illustration of an electrodeposition system.

A process for producing the zinc oxide acicular structure according to the present invention is described below with reference to FIG. 5. As a process for producing it by an electrodeposition process (hereinafter simply "electrodeposition"), three electrodes or two electrodes may be used. FIG. 5 shows a case in which the electrodeposition is carried out using three electrodes. In FIG. 5, reference numeral 51 denotes a reference electrode (e.g., Ag/AgCl); 52, a counter electrode; and 53, a working electrode (or a sample electrode). Reference numeral 55 denotes an electrolytic solution. In such an electrolytic solution, an electrolytic solvent (e.g., water), zinc ions and a cosolute are contained.

In the system shown in FIG. 5, upon application of a desired potential to the electrolytic solution, a zinc oxide acicular structure is grown on the working electrode. The zinc oxide acicular structure includes an embodiment in which the acicular structure consists of one member, and an embodiment in which a plurality of such members aggregate to form a film.

The cosolute which is a characteristic matter in the present invention may be an organic solvent, a halide, a monomer or a polymer thereof, or a surface-active agent. Such a cosolute may be made to mingle in the electrolytic solution, whereby a zinc oxide acicular structure having a very high aspect ratio can be obtained. Where the acicular structure has crystals having a circular or closely circular transverse cross section, the aspect ratio herein termed refers to the proportion of the length of a crystal to the diameter of the corresponding circle. Also, where the acicular structure has crystals having a hexagonal or the like polygonal transverse cross section, the aspect ratio refers to the proportion of the length of a crystal to the minimum length of a line passing the center of gravity of the cross section. Still also, where the acicular structure has crystals having a conical or pyramidal shape, the above transverse cross section means the one at the middle of an acicular crystal.

The reason why the addition of the cosolute can make the zinc oxide acicular structure have a higher aspect is considered to be that the cosolute controls the growth of zinc oxide at the a,b-planes (in the directions horizontal to the substrate), or more accelerates its growth at the c-plane (in the direction vertical to the substrate).

Where Organic Solvent is Used as Cosolute

In the process for producing the zinc oxide acicular structure of the present invention, the use of an organic solvent (solvent medium) as the cosolute enables formation of a zinc oxide acicular structure having a high aspect ratio. Here, what is meant by "high aspect ratio" is that the aspect ratio is higher than that of a case in which the cosolute is not used.

The organic solvent generally refers to a liquid substance used to dissolve a solute, or to a solid organic compound having a relatively low melting point. It may roughly be grouped into two types.

One of them is an aliphatic solvent, which may include, e.g., hexane, cyclohexane, carbon tetrachloride, methanol, ethanol, nitromethane, dimethyl sulfoxide (DMSO), tetrahydrofuran (THF), chloroform, dichloromethane, diethyl ether, 1,2-dimethoxyethane (DME), ethyl acetate, N,N-dimethylformamide (DMF), acetone and acetonitrile.

The other is an aromatic solvent, which may include benzene, toluene, nitrobenzene, naphthalene, chlorobenzene, anisole, pyridine and diphenyl ether. In view of readiness to handle, the former is preferred.

Depending on the difference in dielectric constant, it can also be grouped into a polar solvent and non-polar solvent. It may further be grouped into a protonic solvent and a non-protonic solvent. Any of these may preferably be selected depending on the electrolytic solvent with which they are to be mingled. For example, where water is used as the electrolytic solvent, a polar solvent alcohol is suitable as being readily mixed. The alcohol refers of course to a hydroxyl compound the hydrogen atom of the chain or alicyclic hydrocarbon of which has been substituted with a hydroxyl group OH. In particular, a lower alcohol means an alcohol having 5 or less carbon atoms, and a higher alcohol an alcohol having 6 or more carbon atoms.

Where an electrolytic solution is used in which the water is used as the electrolytic solvent and the lower alcohol is added as the cosolute, a zinc oxide acicular structure having a higher aspect ratio can be obtained than a case in which water is used alone. This is considered due to a change in properties such as viscosity of the electrolytic solution. In particular, ethanol is preferred as the cosolute.

In the case when the higher alcohol is used as the cosolute, it changes the viscosity like the lower alcohol and also acts as a surface-active agent. It comes possible to obtain a zinc oxide acicular structure having a high aspect ratio. As the higher alcohol, hexanol is particularly preferred. Of course, two or more types of alcohols may also be used as cosolutes.

The organic solvent is used in a concentration of 10% or less as volume ratio to the electrolytic solvent.

A mixed substance of any of these organic solvents or a mixed substance containing an organic solvent may be mingled, or of course one type of organic solvent may be mingled to produce the zinc oxide acicular structure.

Where Halide is Used as Cosolute

The use of a salt of a halide as the cosolute to be mingled in the electrolytic solution enables formation of a zinc oxide acicular structure having a high aspect ratio.

Here, the salt of a halide used is a compound capable of dissolving in the electrolytic solvent. Namely, it is a compound capable of generating $Cl^-$, $Br^-$ or $I^-$ ions in the solution.

For example, in the case when water base one is used as the electrolytic solvent, preferred is a compound in which highly polar, K or Na has directly combined with halogen ions. In particular, it is preferable to mingle KCl and/or NaCl. The action of such halogen ions brings about the effect of keeping zinc oxide acicular crystals from coming filmy, and enables formation of the zinc oxide acicular structure having a high aspect ratio. Also, where acetonitrile is used as the electrolytic solvent, it is preferable to use tetrabutylammonium perchloride (TBAP) or the like, having a low polarity.

The salt of a halide may be used in a concentration of, but without any particular limitation to, from 0.001 mol/L (mole per liter) to 1.0 mol/L, which is at a level not so much different from the concentration of Zn ions.

A mixed substance of any of these salts of halides or a mixed substance containing the salt of a halide may be mingled, or of course one type of the salt of a halide may be mingled to produce the zinc oxide acicular structure.

Where Monomer or Polymer Thereof is Used as Cosolute

In the process for producing the zinc oxide acicular structure of the present invention, the use of a monomer or a polymer thereof as the cosolute to be mingled in the electrolytic solution enables formation of an acicular structure having a high aspect ratio. Of course the monomer means a substance serving as a raw material when a polymer is synthesized by polymerization reaction. Also, the polymer herein termed is meant to include dimers and up to polymers having a degree of polymerization of millions. Still also, it is further limited to those capable of dissolving in the electrolytic solvent. For example, in view of readiness to handle, a water base electrolytic solvent may chiefly be used. In such a case, a water-soluble polymer may preferably be used. Here, the water-soluble polymer refers to a polymer capable of dissolving in water. It may include, as natural polymers, proteins and polysaccharide starch, and, as synthetic polymers, polyvinyl alcohol, polyethylene glycol, polyethylene oxide, polyacrylamide and polyvinyl pyrrolidone.

In particular, monomers having a monovalent unsaturated hydrocarbon group vinyl group ($CH_2$=CH—) or polymers thereof are preferred. Polyvinyl alcohol or polyethylene glycol is more preferred in the case when the water base one is used as the electrolytic solvent. Here, the polymer may have a degree of polymerization or an average molecular weight of, but without any particular limitation to, from about 500 to 2,000 in the case of polyvinyl alcohol, and from about 200 to 20,000 in the case of polyethylene glycol, in view of readiness for synthesis. Also, the use of such a polymer, in particular, the polymer having a vinyl group brings about an improvement in adherence between the substrate and the zinc oxide acicular structure grown thereon.

Incorporation of such a polymer brings about a change in viscosity of the electrolytic solution to bring about changes in adherence to the substrate and in the growth rate, and hence the zinc oxide acicular structure crystal having a high aspect ratio can be formed.

The monomer or polymer thereof may appropriately be used in a concentration of, but without any particular limitation to, from 0.01 g/L (gram per liter) to 100 g/L.

A mixed substance of any of these monomers or polymers thereof or a mixed substance containing the monomers or polymers may be mingled, or of course one type of the monomer or polymer thereof may be mingled to produce the zinc oxide acicular structure.

Where Surface-Active Agent is Used as Cosolute

In the process for producing the zinc oxide acicular structure crystal of the present invention, a surface-active agent may be used as the cosolute to be added to the electrolytic solution. The addition of this surface-active agent enables formation of zinc oxide acicular crystals which are slender as diameter, and acicular crystals having a high aspect ratio.

Here, the surface-active agent may roughly be grouped into nonionic ones, cationic ones, anionic ones, and amphoteric ones which are both cationic and anionic. Adding any of these surface-active agents to the electrolytic solution in which at least zinc ions are contained brings about the effect of making the zinc oxide acicular crystals slender in diameter and having a high aspect ratio. In particular, cationic surface-active agents show a preferable tendency. Such cationic surface-active agents are those making use of a sulfonic acid group or a phosphoric acid group as a hydrophilic group. In particular, taking account of readiness to handle and readiness for synthesis, those having an ammonium group as the hydrophilic group are preferred. In particular, the use of a salt the ammonium group of which is a quaternary ammonium, in particular, a quaternary-ammonium salt represented by the following chemical formula, promises growth of crystals having a much higher aspect ratio;

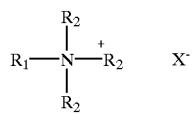

wherein $R_1$ is a long-chain alkyl group having 13 or less carbon atoms, $R_2$ is a methyl group or an ethyl group, and $X^-$ is an anion.

Though any detailed mechanism is unknown, those having a long-chain alkyl group having 14 or more carbon atoms cause problems such that they have a low solubility in solution. Accordingly, the alkyl group may preferably be one having 13 or less carbon atoms. Also, as the number of carbon atoms at a level which does not damage the function of hydrophobic groups of the surface-active agent, it may preferably be 8 or more. In order to improve the polarity, $R_2$ may also preferably be a methyl group or an ethyl group.

As the X corresponding to an anion $X^-$ contained in the quaternary ammonium salt, Cl, Br, I, SCN or a hydroxymethyl group ($-OSO_3CH_3$) is preferred when the solubility is taken into account.

With regard to the amount of the surface-active agent to be added, conditions for forming the zinc oxide acicular crystals may differ depending on the type of the electrolyte contained the electrolytic solution in which at least zinc ions are to be contained, and the surface-active agent may preferably be added in an amount ranging from 1 mmol/L to 0.1 mol/L.

Any one surface-active agent may be added alone. Without any limitation thereto, two or more surface-active agents may also be added. Also, as to the range of the amount in which the surface-active agent is added, it may preferably be added in the amount of from 1 mmol/L to 0.1 mol/L in respect of any surface-active agents.

Substrate

The substrate on which the zinc oxide acicular structure is to be formed is a substrate having conductivity. For example, usable are conductive-glass substrates (e.g., those having a fluorine-doped tin oxide ($SnO_2$:F) film), metal substrates, and substrates comprising an insulating member on which a film having conductivity has been formed.

As long as the substrate has conductivity, a flexible substrate made of plastic or the like may be used. Also, there are no particular limitations on the substrate as long as it is a substrate on which the acicular structure can be formed by electrodeposition.

Electrolytic Solvent

In the process for producing the zinc oxide acicular structure of the present invention, the electrolytic solvent means the liquid substance in which gases or solids dissolved. Also, where a plurality of liquid substances constitute the electrolytic solvent, one which is present in a large quantity is regarded as the electrolytic solvent.

As the electrolytic solvent, water and any organic solvents at large are usable. Those which are liquid at room temperature are preferred. In view of readiness to handle, water is more preferred.

Zinc Ions

Zinc ions are obtainable by mixing in the electrolytic solution a salt which contains zinc. Compounds usable as the salt which contains zinc may include zinc nitrate, zinc chloride, zinc sulfate, zinc carbonate and zinc acetate. Here, a mixed substance of these salts may be used, or of course one type may be used alone.

As conditions for producing the zinc oxide acicular structure, the zinc ions may preferably be in a low concentration, and more preferably in the range of from 0.0005 mol/L to 0.05 mol/L, and still more preferably from 0.001 mol/L to 0.01 mol/L.

Electrodeposition

As a method of producing the zinc oxide acicular structure of the present invention by the process of electrodeposition, three electrodes or two electrodes may be used, where an electrode substrate may be immersed in the electrolytic solution of various types, and a potential may be applied to produce the acicular crystals. For example, the system used when the electrodeposition is carried out using three electrodes is as shown in FIG. 5. The reference electrode 51, the counter electrode 52 and the working electrode 53 are immersed in the electrolytic solution 55 held in a beaker 54. Upon application of a potential, the zinc oxide with acicular structure grows on the working electrode 53 conductive substrate. Here, when Ag/AgCl is used as the reference electrode 51, the electrolytic potential may preferably be in the range of from −0.8 V to −2.0 V, and more preferably be from −0.9 V to −1.5 V. The electrodeposition at near the boiling point of electrolytic solution can be obtained acicular crystals with a better orientation. For example, in the case when water is used as the electrolytic solvent, the electrodeposition may preferably be carried out setting the temperature of the electrolytic solution in the range of from 70° C. to 95° C., and more preferably from 85° C. to 90° C. The temperature may be set variable by means of a mantle heater 56 or the like.

The temperature at the initial stage of growth of the acicular structure may be set as a first temperature (from 70° C. to 95° C.), and thereafter the growth may be continued at a temperature (second temperature) lower than the first temperature. The initial stage of growth is meant to be, e.g., up to the time the acicular structure grows in a crystal length of 0.5 $\mu$m.

Electrodeposition time, irradiation by light and amount of irradiation by light, concentration of active gas such as oxygen, reaction accelerator such as carbohydrate dextrin and its concentration, electrolytic-solution convection conditions and so forth may also be changed to produce acicular crystals in various forms.

Second Category: Acicular Structure

The acicular structure (zinc oxide acicular structure) according to the present invention refers to what is constituted of acicular crystals of zinc oxide. The acicular crystals refers to what is called whiskers, including acicular single crystals free of any defects, and screw-transformed crystals. Of course, they may also partly contain a polycrystalline or amorphous part.

Figure 7A:
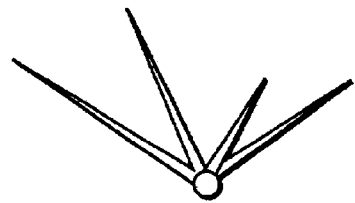
FIGS. 7A, 7B and 7C are schematic sectional illustrations of an acicular crystals.
Figure 7A:
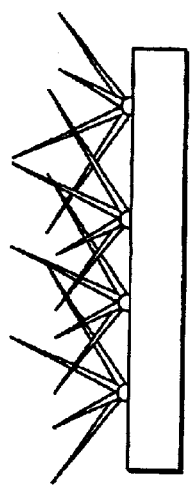
Figure 7B:
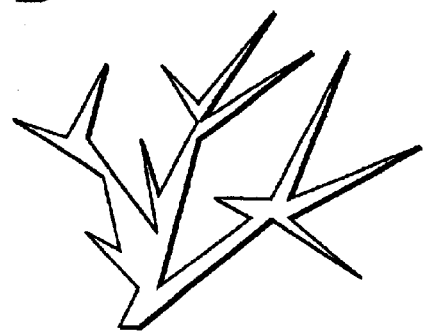
Figure 7B:
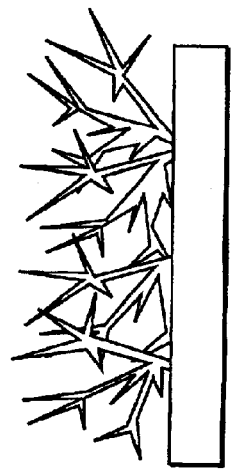
Figure 7C:
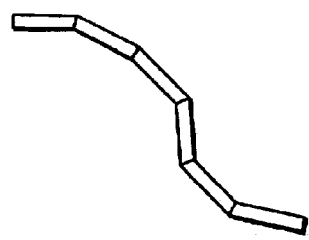
Figure 7C:
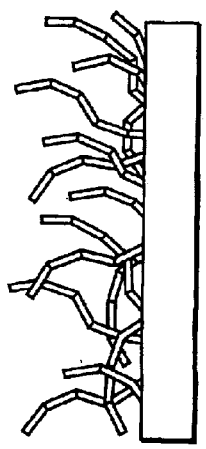

The acicular crystals may further include, as shown in FIGS. 7A to 7C, those in which a large number of acicular crystals have grown from one point, inclusive of tetrapod-like ones (FIG. 7A), those formed in the shape of twigs of trees (FIG. 7B), and those having grown in the shape of polygonal lines (FIG. 7C).

The acicular crystals may also include all of those which are columnar, which are conical, which are conical and having flat ends, and which are columnar and having sharp ends or having flat ends. They may still also include those having the shape of triangular pyramids, quadrangular pyramids, hexagonal pyramids or other polygonal pyramids and any of these polygonal pyramids having flat ends, and those having the shape of triangular prisms, quadrangular prisms, hexagonal prisms or other polygonal prisms, as well as those having the shape of triangular prisms, quadrangular prisms, hexagonal prisms or other polygonal prisms having sharp ends and any of these pyramids having flat ends, and also and any of these but having polygonal-line structure.

The acicular crystals formed may also preferably have an aspect ratio of 5 or more, preferably 10 or more, and more preferably 100 or more. Also, their minimum length of lines passing the center of gravity of the cross sections of acicular crystals may preferably be 500 nm or less, preferably 100 nm or less, and more preferably 50 nm or less. Incidentally, where the acicular crystals are used in electrodes of cells (e.g., fuel cells) or as electron sources of electron-emitting devices, it is better for the above aspect ratio to be higher.

The acicular crystals may further preferably be subjected to c-axis orientation.

Figure 3A:
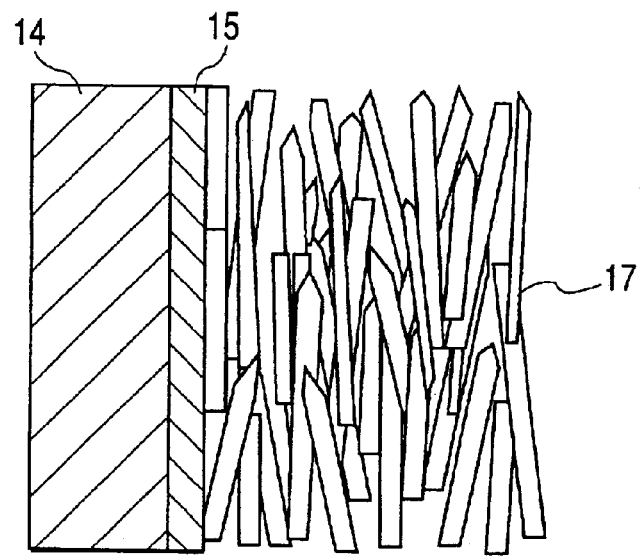
FIGS. 3A and 3B are schematic sectional illustrations of how zinc oxide acicular crystals according to the present invention join to the substrate.
Figure 3B:
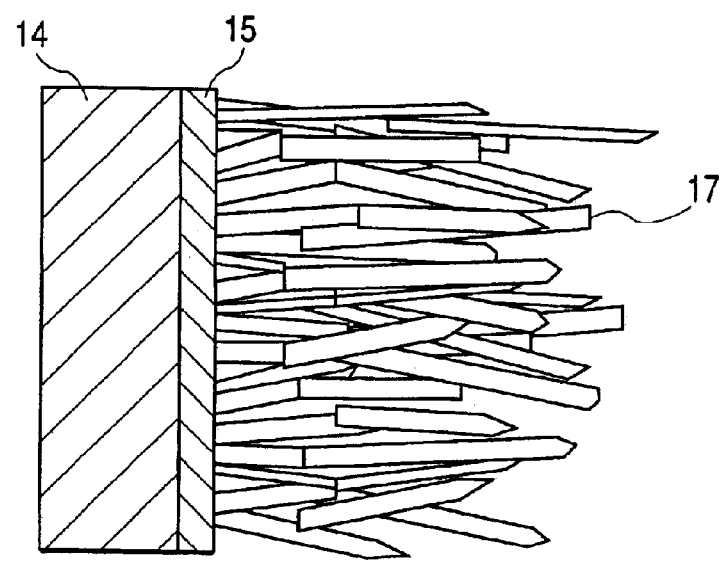
Figure 4A:
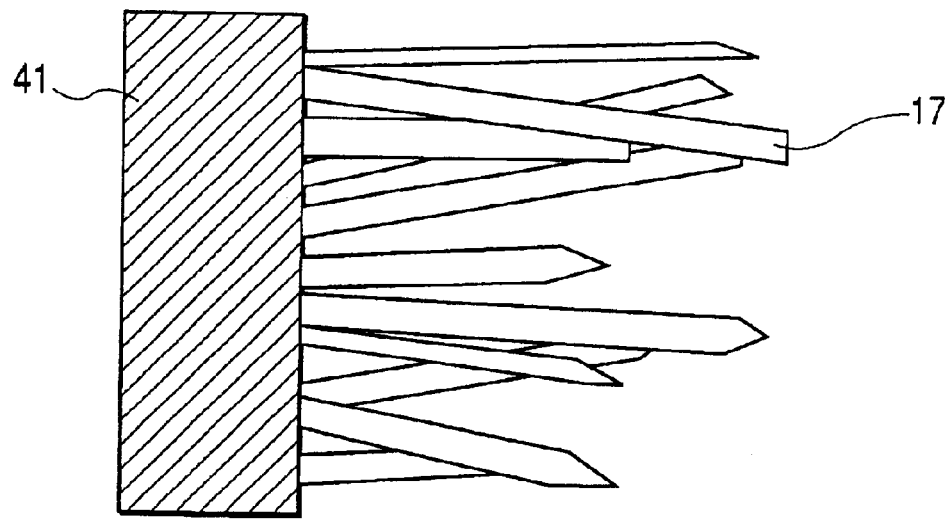
FIGS. 4A and 4B are schematic sectional illustrations of how zinc oxide acicular crystals according to the present invention grow on the substrate.
Figure 4B:
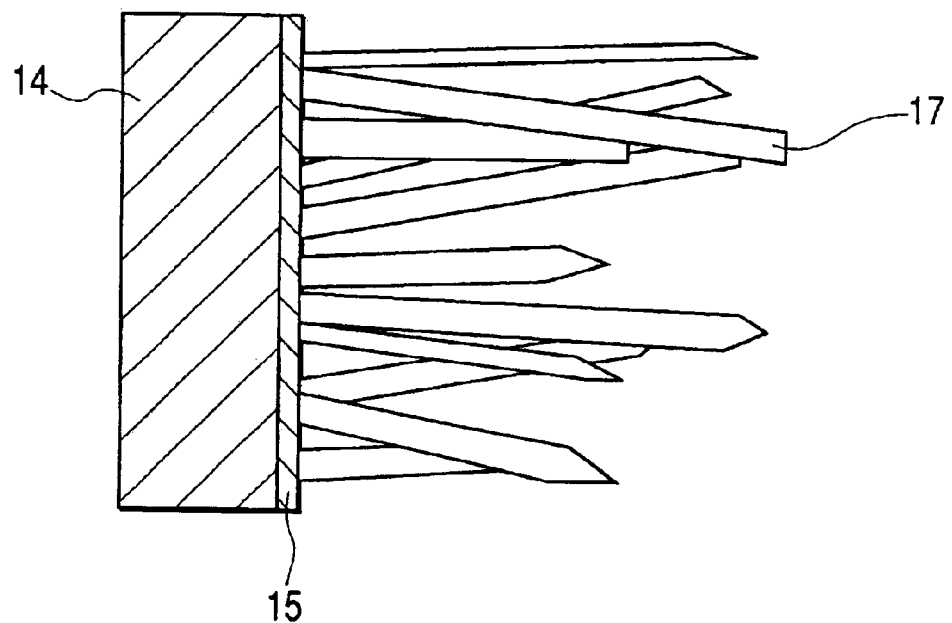

When the acicular crystals are produced by such electrodeposition, the acicular crystals may preferably be formed in the direction vertical to the glass substrate, rather than in the state they overlap in parallel to a glass substrate 14 as shown in FIG. 3A. That is, they may preferably be formed in the state the acicular crystals are joined to a transparent-electrode layer 15 or a metal substrate 41 at their starting ends, as can be seen in FIGS. 4A and 4B showing those grown to extend linearly from the substrate or in FIG. 3B showing those grown in the shape of twigs of trees. In FIGS. 3A and 3B, reference numeral 14 denotes the glass substrate; 15, the transparent-electrode layer; and 17, the acicular structure. In FIGS. 4A and 4B, reference numeral 41 denotes the metal substrate.

The axial direction of the acicular crystals may preferably be at an angle of from 60° to 90°, and more preferably from 80° to 90°, to the main plane of the substrate. Also, as the form of the acicular crystals, they may preferably be in a linear form.

Third Category: Photoelectric Conversion Device

A photoelectric conversion device making use of the acicular structure embodied as described above is described below. As the photoelectric conversion device, what is shown is a Grätzel-type dye-sensitized solar cell.

Grätzel et al. report that a dye and a semiconductor electrode have been further improved to achieve performance comparable to silicon solar cells (J. Am. Chem. Soc. 115, p.6382, 1993; U.S. Pat. No. 5,350,644). Here, a ruthenium dye is used as the dye and an anatase type porous titanium oxide ($TiO_2$) as the semiconductor electrode.

Figure 6:
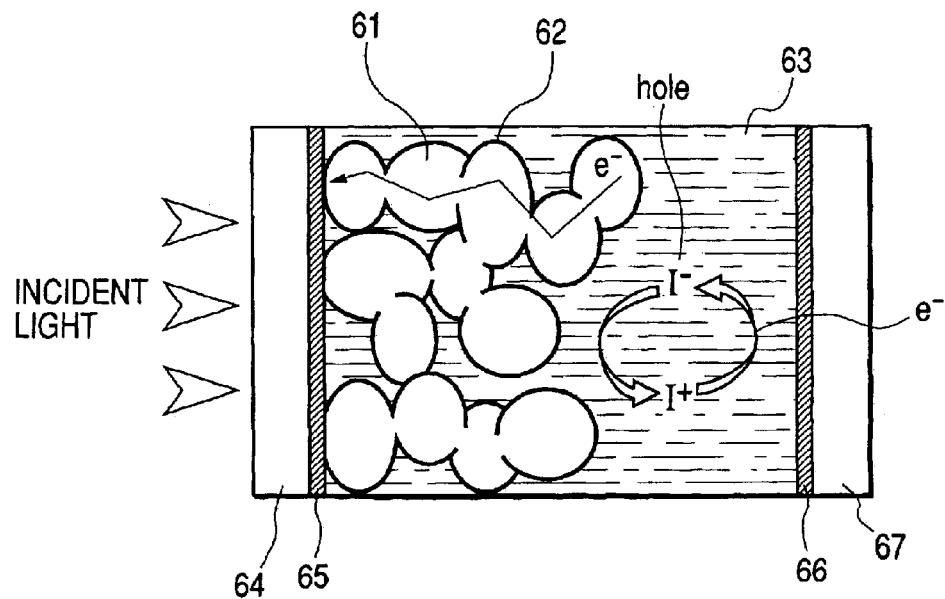
FIG. 6 is a schematic sectional illustration of a conventional Grätzel cell.

FIG. 6 is a diagrammatic sectional view schematically showing the construction of a photochemical cell making use of a Grätzel-type dye-sensitized semiconductor electrode (hereinafter "Grätzel cell".

In FIG. 6, reference numerals 64 and 67 denote glass substrates; 65, a transparent electrode (anode) formed on the surface of the glass substrate 64; and 61, an anatase type porous titanium oxide layer, which is made of a porous joined material comprised of fine titanium oxide particles jointed to one another. Also, reference numeral 62 denotes a dye layer which has been joined to the fine titanium oxide particle surfaces and acts as a light-absorbing layer. Reference numeral 63 denotes an electrolyte; and 66, a transparent electrode (cathode) formed on the surface of the glass substrate 67.

A Method of producing the Grätzel cell is described below with reference to FIG. 6.

First, a film of anatase type fine $TiO_2$ particles 61 is formed on the glass substrate 64 provided with the transparent electrode 65. Various methods are available for its formation. Usually, the electrode is coated thereon with a paste in which anatase type fine $TiO_2$ particles having a fine-particle diameter of about 20 nm have been dispersed, followed by baking at 350° C. to 500° C. to form the film of anatase type fine $TiO_2$ particles in a thickness of about 10 $\mu$m. Here, the fine particles join well to one another, thus a film with a structure having a porosity of about 50% and a roughness factor (substantial surface area/apparent surface area) of about 1,000 is obtained.

Next, a dye is adsorbed on this electrode with fine particles. Various substances are studied as the dye. Usually, Ru complexes are used. The electrode is immersed in a solution having this dye dissolved therein, followed by drying, whereupon the light-absorbing layer 62 is combined to the surface of the fine $TiO_2$ particles. As a solvent therefor, ethanol, acetonitrile or the like is used, which is capable of dissolving the dye well, also does not inhibit the adsorption of the dye on the electrode and is electrochemically inert even if it remain on the electrode surface.

Next, the glass substrate 67 provided with the transparent electrode 66 is also prepared as the counter electrode, and an ultra-thin film of platinum or graphite is formed on its surface. This thin film acts as a catalyst when electric charges are exchanged in the course of redox.

Then, the electrolyte 63 is so superposed as to be held between the above two electrodes. Thus, the Grätzel cell is completed. As a solvent for the electrolyte, acetonitrile, ethylene carbonate or the like is used, which is electrochemically inert and also capable of dissolving an electrolyte in a sufficient quantity. Also, as the electrolyte, $I^-/I_3^-$, $Br^-/Br_3^-$ or the like is used, which is a redox pair of stable ions. For example, when the $I^-/I_3^-$ pair is made up, an ammonium salt of iodine and iodine itself are mixed.

Thereafter, the cell may preferably be sealed with an adhesive or the like in order to ensure durability.

Subsequently, the operating principle of the Grätzel cell is described. Light is made incident on the left side as viewed in FIG. 6, whereupon electrons in the dye constituting the light-absorbing layer 62 are excited by the incident light, and move to the conduction band of titanium oxide. The dye standing oxidized upon loss of electrons receives electrons rapidly from iodide ions of the electrolyte 63 to come reduced, and returns to the original state. The electrons having been injected into the titanium oxide layer 61 moves between fine titanium oxide particles by the mechanism such as hopping conduction to reach the anode 65. Also, the iodide ions having come to stand oxidized ($I_3^-$) receive electrons from the cathode 66 to come reduced, and return to the original state ($I^-$).

As can be presumed from the above operating principle, in order that the electrons and holes produced in the dye separate and move in a good efficiency, the energy level of the electrons standing excited the dye has must be higher than the conduction band of $TiO_2$ and the energy level of the holes of the dye must be lower than the redox level.

In order for such a Grätzel cell to substitute for silicon solar cells, it becomes necessary to achieve an energy conversion efficiency which is higher than ever, and much higher short-circuit current, open-circuit voltage, fill factor and durability.

In dye sensitization type cells including the Grätzel cell described above, the dye layer has insufficient light absorption, and hence is made to have a large surface area to enlarge substantial amount of light absorption. Without limitation to such dye sensitization, the present invention can widely be utilized in photoelectric conversion devices in general which are so constructed as to have a large surface area because of insufficient light absorption. As a method of enlarging this surface area, the method of dispersing and joining fine particles as in the Grätzel cell is simple, but it has a problem that the movement of electrons is not well efficient. For example, in the Grätzel cell, when a case in which light is made incident on the anode transparent electrode 65 side having the titanium oxide semiconductor layer 61 is compared with a case in which light is made incident on the cathode transparent electrode 66 side, the former shows a better photoelectric conversion efficiency in many cases. This not only is due to the difference in the amount of light absorbed by the dye, but also suggests that the probability at which the electrons excited upon absorption of light move through the titanium oxide semiconductor layer 61 and reach the anode transparent electrode 65 lowers on as the position of excitation by light come away from the transparent electrode 66. More specifically, this suggests that, in Grätzel cells having many crystal grain boundaries, any well efficient movement of electrons has not been achieved. Also, where the semiconductor film produced by the method as described above is used in the Grätzel cell, there are problems on its adherence to the substrate and on the crystal grain boundaries.

Figure 1A:
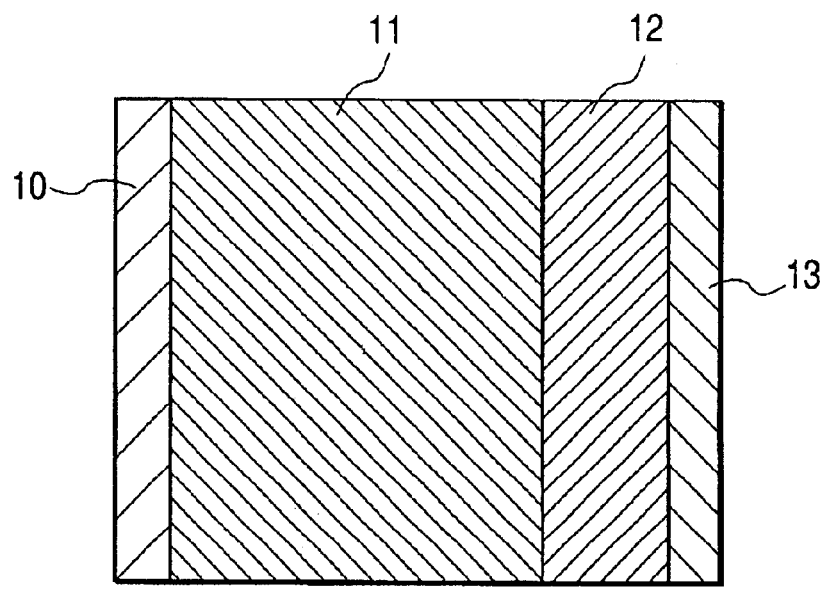
FIGS. 1A and 1B are schematic sectional views of a photoelectric conversion device according to the present invention.
Figure 1B:
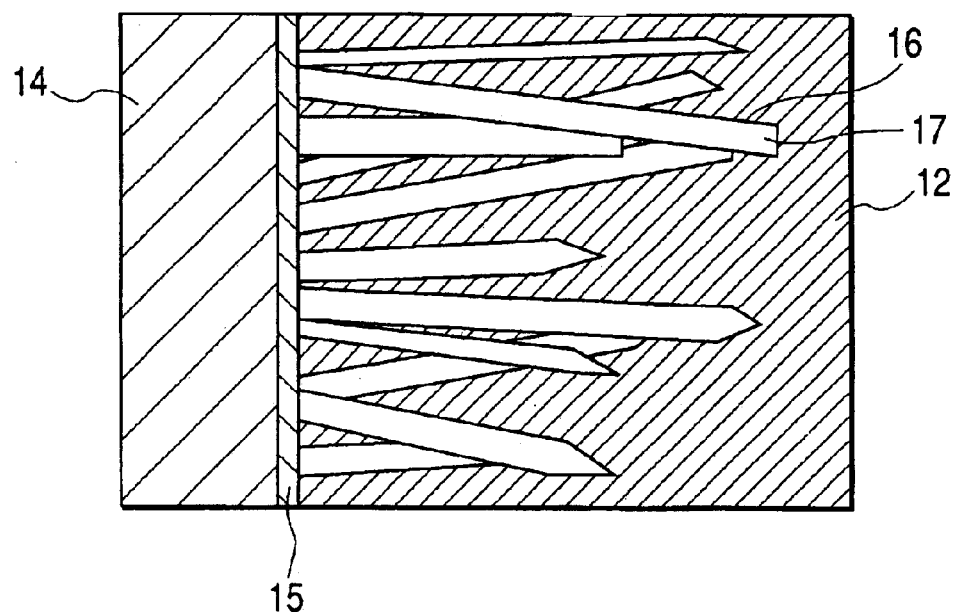

FIGS. 1A and 1B illustrates an example of the construction of a photoelectric conversion device according to the present invention. In FIGS. 1A and 1B, reference numeral 10 denotes a substrate with electrode; 11, an absorption layer, modified semiconductor crystal layer; 12, a charge transport layer; and 13, a substrate with electrode. The substrate 10 with electrode consists of, e.g., a glass substrate 14 provided with a transparent-electrode layer 15. The absorption layer, modified semiconductor crystal layer 11 consists of a semiconductor acicular-crystal layer 17 which is a layer containing the acicular structure of the present invention, and a light absorption layer 16 formed on the former's surface. The semiconductor acicular-crystal layer 17 serves as one charge transport layer, thus the light absorption layer 16 is formed between this charge transport layer (layer 17) and the charge transport layer 12. The charge transport layer 12 is so provided as to enter the spaces between acicular crystals.

When the acicular crystal layer according to the present invention is compared with the fine $TiO_2$ particle crystal layer described previously, the acicular crystal layer can have a smaller probability at which the electrons or holes produced by light excitation are scattered before they move to the collector electrode. In particular, in the case when as shown in FIG. 1B all the acicular crystals stand joined to the electrode at their one ends, the influence of grain boundaries is almost eliminated in the movement of electrons or holes, compared with the Grätzel cell.

In the photoelectric conversion device according to the present invention, the zinc oxide acicular crystals (layer 17) constituting the semiconductor crystal layer 11 serve as an n-type wide-gap semiconductor, and hence it requires a p-type wide-gap semiconductor, an electrolyte containing a redox pair, or an electron donor type charge transport layer 12 formed of, e.g., a polymeric conductor, interposing the light absorption layer 16 such as a dye layer.

The side to be irradiated by light depends on which side the transparent electrode is used.

Figure 2A:
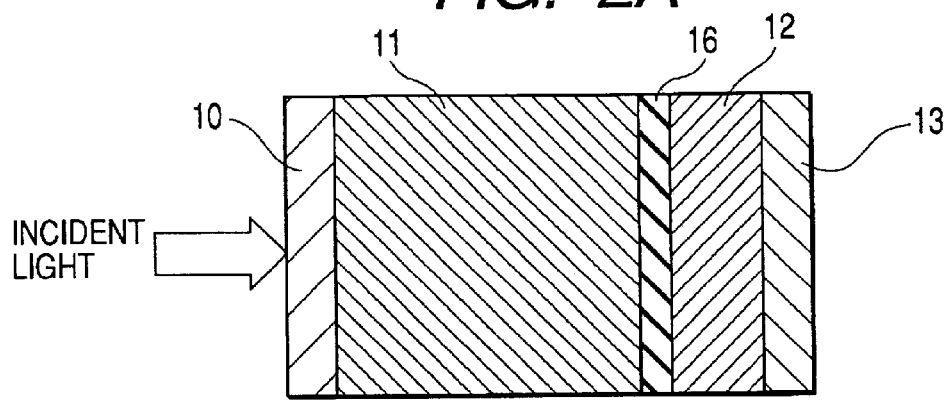
FIGS. 2A, 2B and 2C are schematic sectional illustrations of examples of the construction of irradiation by light, transparent electrode and acicular zinc oxide crystal layer according to the present invention.
Figure 2B:
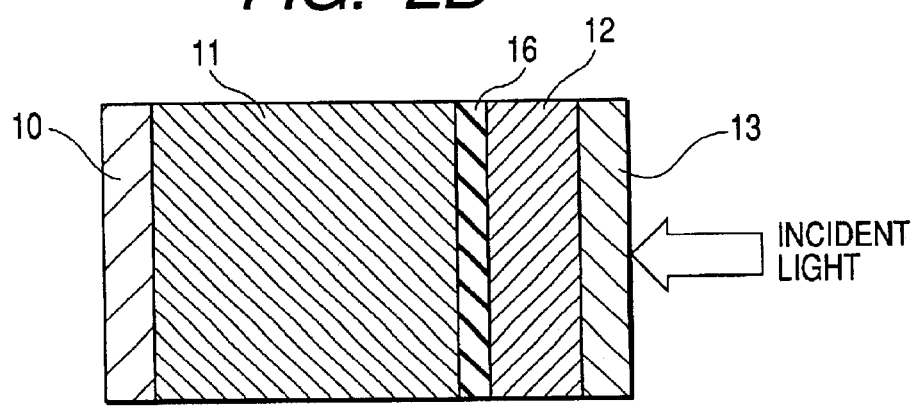
Figure 2C:
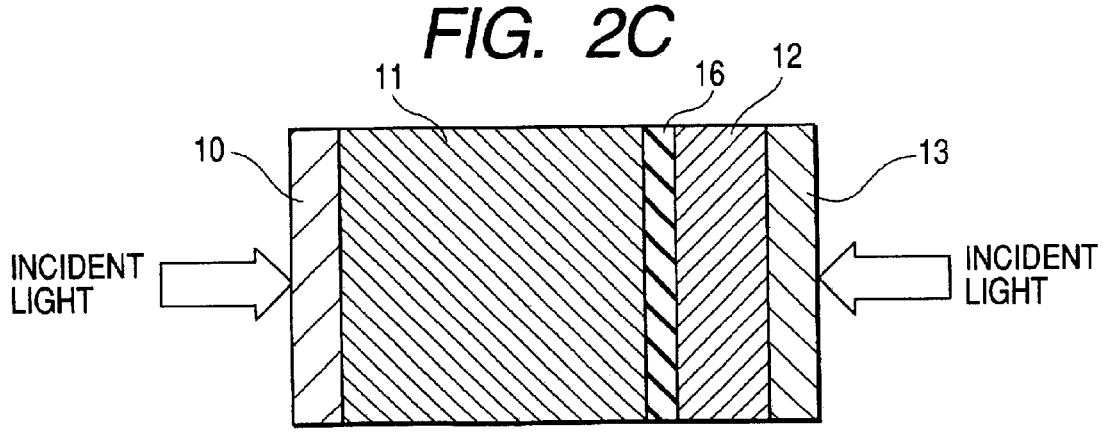

The construction shown in FIG. 2A is an example in which, like the Grätzel cell, a transparent electrode 10 (glass substrate with electrode) is used on the side of a semiconductor crystal layer 11. Reference numeral 12 denotes a charge transport layer; 13, a transparent electrode (glass substrate with electrode); and 16, a light absorption layer. The construction shown in FIG. 2B is construction opposite thereto. Either construction may be employed as long as the irradiation light reaching the light absorption layer 16 is less absorbed and reflected. Also, as shown in FIG. 2C, the device may also be so constructed that the irradiation by light can be made on both sides. Which construction be employed depends on how the acicular crystals are produced, and on how the charge transport layer 12 to be provided in combination is formed and also on its composition. For example, where the acicular-crystals are produced on a Pt film by electrodeposition, the irradiation by light can not be made on the side of the acicular-crystal layer. Where the acicular crystals are produced by a low-temperature process like the baking of acicular crystal powder, they can be produced without causing any deterioration of the transparent-electrode layer, and hence either side can be used as the light irradiation side.

Light Absorption Layer

As the light absorption layer of the photoelectric conversion device of the present invention, any of various semiconductor layers and dye layers may be used. As semiconductors used therefor, preferred are i-type amorphous semiconductors and direct transition type semiconductors having a large absorptivity coefficient. As dyes, preferred are organic dyes and natural dyes such as metal complex dyes and/or polymethine dyes, perylene dyes, Rose Bengale, Eosin Y, mercurochrome, santalin dyes and cyanine dyes. The dyes may preferably be those having suitable linkage groups to the surfaces of fine semiconductor particles. As preferable linkage groups, they may include a COOH group, a cyano group, a $PO_3H_2$ group, and chelating groups having $\pi$-conductivity such as oxime, dioxime, hydroxyquinoline, salicylate and $\alpha$-keto-enolate. Of these, a COOH group and a $PO_3H_2$ group are particularly preferred. In the case when the dye used in the present invention is a metal complex dye, a ruthenium complex dye (such as $Ru(dcbpy)_2(SCN)_2$; dcbpy: 2,2-bipyridine-4,4'-dicarboxylic acid) may be used. Here, it is important that the oxidation-reduction product is stable. Also, the potential of electrons excited in the light absorption layer, i.e., the potential of the dye excited by light (LUMO potential of dye), and the conduction band potential in the semiconductor must be higher than the electron acceptor potential of the electron acceptor type charge transport layer (e.g., conduction band potential of an n-type semiconductor), and also the potential of holes produced in the light absorption layer by light excitation must be lower than the electron donor potential of the electron donor type charge transport layer (e.g., valence band potential of a p-type semiconductor or potential of the redox pair). In order to enhance the photoelectric conversion efficiency, it is also important to lower the probability of recombination of electrons-holes excited in the vicinity of the light absorption layer.

Charge Transport Layer, Opposing Pole of Zinc Oxide Acicular Crystals

Where n-type acicular crystals are used, it is required to form a hole transport layer (i.e., a p-type charge transport layer) interposing the light absorption layer. In this hole transport layer, like wet-type solar cells, the redox system may be used. Even when the redox is used, available are not only a simple solution system but also a method in which carbon powder is used as a holding material or the electrolyte is made into a gel. Also available is a method in which a molten salt or an ion-conductive polymer is used. Still also, as a method of transporting electrons (holes), an electrolytically polymerized organic polymer or a p-type semiconductor such as CuI, CuSCN or NiO may by used.

In order to make the charge transport layer enter the spaces between acicular crystals, what is suited for its formation is penetration, which is utilizable for liquids, polymers or the like, electrodeposition, which is utilizable for solid transport layers, or CVD (chemical vapor deposition).

Electrodes

Electrodes are so provided as to adjoin to the charge transport layer and semiconductor acicular-crystal layer. The electrodes may be provided over the whole surfaces of the outsides of these layers, or provided partly. Where the charge transport layer is not solid, it is better for the layers to be provided over the whole surfaces, from the viewpoint of retaining the charge transport layer. On the surface of the electrode adjoining to the charge transport layer, it is preferable to beforehand provide a catalyst such as Pt or C in order to, e.g., make the redox pair reduce in a good efficiency.

As the electrode on the light incident side, a transparent electrode comprised of an indium-tin composite oxide or a tin oxide doped with fluorine may preferably be used. Where the layer coming in contact with the electrode on the light incident side (the charge transport layer or semiconductor acicular-crystal layer) has a sufficiently low electrical resistance, a partial electrode as exemplified by a finger electrode may also be provided as the electrode on the light incident side.

In the electrode not on the light incident side, a metal electrode comprised of Cu, Ag, Al or the like may preferably be used.

Substrates

The material and thickness of the substrates may appropriately be designed in accordance with the durability required for photoelectric conversion devices (photovoltaic devices). As the substrate on the light incident side, a glass substrate, a plastic substrate or the like may be used as long as it is transparent. As the substrate not on the light incident side, a metal substrate, a ceramic substrate or the like may appropriately be used. On the surface of the substrate on the light incident side, it is preferable to provide a reflection preventive film comprised of $SiO_2$ or the like.

The electrodes described previously may be made to have also the function as the substrates so that any substrates need not be provided as members different from the electrodes.

Sealing

Not shown in the drawings, the photoelectric conversion device of the present invention may be sealed at the part other than the substrates. This is preferable from the viewpoint of improving weatherability. As a sealing medium, an adhesive or a resin may be used. Also, when the device is sealed on the light incident side, the sealing medium may preferably be light-transmissive.

What is chiefly characteristic in the process for producing such a photoelectric conversion device according to the present invention is that the zinc oxide acicular structure having a high aspect ratio is produced by electrodeposition and the electron acceptor type charge transport layer is formed.

Other Devices

The zinc oxide acicular structure described in the above preferred embodiments may also be used as electrodes for cells such as fuel cells and lithium ion cells, or in sensors, electron sources, lasers and so forth.

EXAMPLES

The present invention is described below in greater detail by giving Examples.

Example 1

In this Example, an instance in which zinc oxide acicular crystals are produced on a conductive substrate by electrodeposition is described with reference to FIG. 4B.

A conductive-glass substrate (coated with F-doped $SnO_2$, 10 Ω/square) as the working electrode was prepared for use. As the electrolytic conditions of the prepared samples, an electrolytic solution containing 0.01 mol/L (mole per liter) of zinc nitrate in a water:ethanol 9:1 mixed solvent was electrodeposited by −1.2V for 5,000 seconds at 85° C. After the electrodeposition, zinc oxide acicular crystals (zinc oxide acicular structure 17) had grown on the electrode 15 surface as shown in FIG. 4B. These zinc oxide acicular crystals were about 200 nm in diameter and about 3 μm in length.

As a comparative example, the same electrolytic solution as the above except that the ethanol was removed was also prepared, and zinc oxide crystals were grown in the same way.

As a result of measurement, the zinc oxide acicular structure of the present invention was found to have a smaller crystal diameter and a larger crystal length and accordingly have a higher aspect ratio, than the comparative example. Stated specifically, the aspect ratio was 15 in the case when the cosolute was added, whereas it was 9 in the case when the cosolute was not added. Herein, the aspect ratio was calculated on the basis of observation of SEM (scanning electron microscope) photographs.

Incidentally, not in the production process carried out by electrodeposition but in a process making use of a film deposition method such as a CVD or PVD (physical vapor deposition) method, there is a problem on uniformity when formed in a large area. In the present invention, however, the problem on uniformity can be small as long as large-size electrodeposition system and substrate are used. Also, in this Example, the growth can be made on the substrate. Still also, in the CVD or PVD method, the types of gases to be mixed, the pressure, the heating of sources or substrates at high temperature and so forth are important factors, and accordingly a large-scale production system is required, bringing about a problem on cost at the time of mass production. However, the electrodeposition system as shown in FIG. 5 enables control of such cost.

Example 2

In this Example, an instance in which zinc oxide acicular crystals are produced on a conductive substrate by electrodeposition is described with reference to FIG. 4A.

A platinum substrate was prepared for use. This substrate was set as the working electrode and was immersed in an electrolytic solution prepared by dissolving 0.01 mol/L of zinc nitrate in a water:acetonitrile 9:1 mixed solvent, and this electrolytic solution was heated to 85° C. Then, a potential of −1.0 V was applied for 5,000 seconds to effect electrodeposition. After the electrodeposition, the substrate was observed to find that zinc oxide acicular crystals (zinc oxide acicular structure 17) had grown on the substrate 41 surface as shown in FIG. 4A. These zinc oxide acicular crystals were about 300 nm in diameter and about 4 μm in length.

As a comparative example, the same electrolytic solution as the above except that the acetonitrile was removed was also prepared, and zinc oxide crystals were grown in the same way.

As a result of measurement, the zinc oxide acicular structure of the present invention was found to have a smaller crystal diameter and a larger crystal length and accordingly have a higher aspect ratio, than the comparative example. Stated specifically, the aspect ratio was 13 in the case when the cosolute was added, whereas it was 9 in the case when the cosolute was not added.

Example 3

In this Example, an instance in which zinc oxide acicular crystals are produced on a conductive substrate by electrodeposition is described with reference to FIG. 4B.

A conductive-glass substrate (coated with F-doped $SnO_2$, 10 Ω/square) was prepared for use. This substrate was set as the working electrode and was immersed in an electrolytic solution prepared by dissolving 0.01 mol/L of zinc nitrate in a water:n-hexanol 99:1 mixed solvent, and this electrolytic solution was heated to 85° C. Then, a potential of −1.3 V was applied for 5,000 seconds to effect electrodeposition. After the electrodeposition, the substrate was observed to find that zinc oxide acicular crystals (zinc oxide acicular structure 17) had grown on the electrode 15 surface as shown in FIG. 4B. These zinc oxide acicular crystals were about 500 nm in diameter and about 5 μm in length.

As a comparative example, the same electrolytic solution as the above except that the n-hexanol was removed was also prepared, and zinc oxide crystals were grown in the same way.

As a result of measurement, the zinc oxide acicular structure of the present invention was found to have a smaller crystal diameter and a larger crystal length and accordingly have a higher aspect ratio, than the comparative example.

Example 4

In this Example, an instance in which zinc oxide acicular crystals are produced on a conductive substrate by electrodeposition is described with reference to FIG. 4B.

A conductive-glass substrate (coated with F-doped $SnO_2$, 10 Ω/square) was prepared for use. This substrate was set as the working electrode and was immersed in an aqueous electrolytic solution in which 0.01 mol/L of zinc nitrate and 0.01 mol/L of potassium chloride were mingled, and this electrolytic solution was heated to 85° C. Then, a potential of −1.2 V was applied for 5,000 seconds to effect electrodeposition. After the electrodeposition, the substrate was observed to find that zinc oxide acicular crystals (zinc oxide acicular structure 17) had grown on the electrode 15 surface as shown in FIG. 4B. These zinc oxide acicular crystals were about 400 nm in diameter and about 4.5 μm in length.

As a comparative example, the same electrolytic solution as the above except that the potassium chloride was removed was also prepared, and zinc oxide crystals were grown in the same way.

As a result of measurement, the zinc oxide acicular structure of the present invention was found to have a smaller crystal diameter and a larger crystal length and accordingly have a higher aspect ratio, than the comparative example.

Example 5

In this Example, an instance in which zinc oxide acicular crystals are produced on a conductive substrate by electrodeposition is described with reference to FIG. 4B.

A conductive-glass substrate (coated with F-doped $SnO_2$, 10 Ω/square) was prepared for use. This substrate was set as the working electrode and was immersed in an aqueous electrolytic solution in which 0.01 mol/L of zinc nitrate and 0.01 mol/L of sodium chloride were mingled, and this electrolytic solution was heated to 85° C. Then, a potential of −1.2 V was applied for 10,000 seconds to effect electrodeposition. After the electrodeposition, the substrate was observed to find that zinc oxide acicular crystals (zinc oxide acicular structure 17) had grown on the electrode 15 surface as shown in FIG. 4B. These zinc oxide acicular crystals were about 450 nm in diameter and about 6 μm in length.

As a comparative example, the same electrolytic solution as the above except that the sodium chloride was removed was also prepared, and zinc oxide crystals were grown in the same way.

As a result of measurement, the zinc oxide acicular structure of the present invention was found to have a smaller crystal diameter and a larger crystal length and accordingly have a higher aspect ratio, than the comparative example. Stated specifically, the aspect ratio was 13 in the case when the cosolute was added, whereas it was 9 in the case when the cosolute was not added.

Example 6

In this Example, an instance in which zinc oxide acicular crystals are produced on a conductive substrate by electrodeposition is described with reference to FIG. 4B.

A conductive-glass substrate (coated with F-doped $SnO_2$, 10 Ω/square) was prepared for use. This substrate was set as the working electrode and was immersed in an aqueous electrolytic solution in which 0.01 mol/L of zinc nitrate, 0.005 mol/L of zinc chloride and 0.005 mol/L of potassium chloride were mingled, and this electrolytic solution was heated to 85° C. Then, a potential of −1.2 V was applied for 5,000 seconds to effect electrodeposition. After the electrodeposition, the substrate was observed to find that zinc oxide acicular crystals (zinc oxide acicular structure 17) had grown on the electrode 15 surface as shown in FIG. 4B. These zinc oxide acicular crystals were about 200 nm in diameter and about 3.5 μm in length.

As a comparative example, the same electrolytic solution as the above except that the potassium chloride was removed was also prepared, and zinc oxide crystals were grown in the same way.

As a result of measurement, the zinc oxide acicular structure of the present invention was found to have a smaller crystal diameter and a larger crystal length and accordingly have a higher aspect ratio, than the comparative example. Stated specifically, the aspect ratio was 18 in the case when the cosolute was added, whereas it was 9 in the case when the cosolute was not added.

Example 7

In this Example, an instance in which zinc oxide acicular crystals are produced on a conductive substrate by electrodeposition is described with reference to FIG. 4B.

A conductive-glass substrate (coated with F-doped $SnO_2$, 10 Ω/square) was prepared for use. This substrate was set as the working electrode and was immersed in an aqueous electrolytic solution in which 0.01 mol/L of zinc nitrate and 0.01 mol/L of sodium chloride were mingled, followed by bubbling with $O_2$ for 5 minutes, and this electrolytic solution was heated to 85° C. Then, a potential of −1.2 V was applied for 5,000 seconds to effect electrodeposition. After the electrodeposition, the substrate was observed to find that zinc oxide acicular crystals (zinc oxide acicular structure 17) had grown on the electrode 15 surface as shown in FIG. 4B. These zinc oxide acicular crystals were about 250 nm in diameter and about 3 μm in length.

As a comparative example, the same electrolytic solution as the above except that the sodium chloride was removed was also prepared, and zinc oxide crystals were grown in the same way.

As a result of measurement, the zinc oxide acicular structure of the present invention was found to have a smaller crystal diameter and a larger crystal length and accordingly have a higher aspect ratio, than the comparative example. Stated specifically, the aspect ratio was 12 in the case when the cosolute was added, whereas it was 9 in the case when the cosolute was not added.

Example 8

In this Example, an instance in which zinc oxide acicular crystals are produced on a conductive substrate by electrodeposition is described with reference to FIG. 4B.

A conductive-glass substrate (coated with F-doped $SnO_2$, 10 Ω/square) was prepared for use. This substrate was set as the working electrode and was immersed in an aqueous electrolytic solution in which 0.01 mol/L of zinc nitrate and 0.2 g/L of polyvinyl alcohol (degree of polymerization: 1,400) were mingled, and this electrolytic solution was heated to 85° C. Then, a potential of −1.2 V was applied for 5,000 seconds to effect electrodeposition. After the electrodeposition, the substrate was observed to find that zinc oxide acicular crystals (zinc oxide acicular structure 17) had grown on the electrode 15 surface as shown in FIG. 4B. These zinc oxide acicular crystals were about 200 nm in diameter and about 3.5 μm in length.

As a comparative example, the same electrolytic solution as the above except that the polyvinyl alcohol was removed was also prepared, and zinc oxide crystals were grown in the same way.

As a result of measurement, the zinc oxide acicular structure of the present invention was found to have a smaller crystal diameter and a larger crystal length and accordingly have a higher aspect ratio, than the comparative example. Stated specifically, the aspect ratio was 18 in the case when the cosolute was added, whereas it was 9 in the case when the cosolute was not added.

Example 9

In this Example, an instance in which zinc oxide acicular crystals are produced on a conductive substrate by electrodeposition is described with reference to FIG. 4B.

A conductive-glass substrate (coated with F-doped $SnO_2$, 10 Ω/square) was prepared for use. This substrate was set as the working electrode and was immersed in an aqueous electrolytic solution in which 0.01 mol/L of zinc nitrate and 0.2 g/L of polyethylene glycol (average molecular weight: 4,000) were mingled, and this electrolytic solution was heated to 85° C. Then, a potential of −1.2 V was applied for 10,000 seconds to effect electrodeposition. After the electrodeposition, the substrate was observed to find that zinc oxide acicular crystals (zinc oxide acicular structure 17) had grown on the electrode 15 surface as shown in FIG. 4B. These zinc oxide acicular crystals were about 300 nm in diameter and about 6 μm in length.

As a comparative example, the same electrolytic solution as the above except that the polyethylene glycol was removed was also prepared, and zinc oxide crystals were grown in the same way.

As a result of measurement, the zinc oxide acicular structure of the present invention was found to have a smaller crystal diameter and a larger crystal length and accordingly have a higher aspect ratio, than the comparative example. Stated specifically, the aspect ratio was 20 in the case when the cosolute was added, whereas it was 9 in the case when the cosolute was not added.

Example 10

In this Example, an instance in which an acicular zinc oxide electrode is produced by electrodeposition and is used in a photoelectric conversion device is described with reference to FIGS. 1A and 1B.

A conductive-glass substrate (coated with F-doped $SnO_2$, 10 Ω/square) was prepared for use. This substrate was set as the working electrode and was immersed in an electrolytic solution prepared by dissolving 0.01 mol/L of zinc nitrate in a water:ethanol 9:1 mixed solvent, and this electrolytic solution was heated to 90° C. Then, a potential of −1.2 V was applied for 20,000 seconds to effect electrodeposition.

After the electrodeposition, the conductive-glass substrate was observed to find that zinc oxide-acicular crystals constituting the semiconductor acicular-crystal layer 17 had grown on the conductive-glass substrate surface in the direction vertical thereto as shown in FIG. 1B. The zinc oxide acicular crystals were from 200 nm to 300 nm in diameter and from 10 $\mu$m to 12 $\mu$m in length.

The light absorption layer 16 was also formed using a dye. Stated specifically, a ruthenium complex Ru{(dcbpy)(COOH)$_2$}$_2$(SCN)$_2$ as reported by Grätzel et al. was used. The dye was dissolved in distilled ethanol, and in the resultant solution the conductive-glass substrate having the zinc oxide acicular crystals formed thereon was immersed for 24 hours to make the zinc oxide acicular crystals adsorb the dye, followed by drying at a temperature of about 80° C.

The charge transport layer 12 was also formed using a $I^-/I_3^-$ redox pair. As the electrolyte, 0.46 mol/L of tetrapropylammonium iodide and 0.06 mol/L of iodine were used, and as the solvent a mixed solvent of 80 vol. % of ethylene carbonate and 20 vol. % of acetonitrile was used. This mixed solvent was dropped on the conductive-glass substrate having the zinc oxide acicular crystals and light absorption layer formed thereon, and thereafter the substrate 13 with electrode was put together thereon to set up a cell. As the substrate 13 with electrode, a conductive-glass substrate on which platinum was deposited by sputtering in a thickness of 10 nm was used.

As a comparative example, a cell was set up by the same production steps as the above except that ZnO powder composed chiefly of particles of 100 nm in diameter and having been heat-treated was used to form ZnO particle crystals. Then, on the side of the substrate 13 with electrode, the cell of this Example and the comparative example each was irradiated by light of a 500 W xenon lamp fitted with an ultraviolet-screening filter. Then, the value of photoelectric current generated by photoelectric conversion reaction having taken place here was measured.

As a result of measurement, the cell of this Example was found to have been improved in both the value of short-circuit current and the value of open-circuit voltage by about 7% compared with the comparative example. This is considered due to the fact that the use of the zinc oxide acicular crystals has lessened the internal resistance of the electron acceptor type charge transport layer.

Example 11

In this Example, an instance in which an acicular zinc oxide electrode is produced by electrodeposition and is used in a photoelectric conversion device is described with reference to FIGS. 1A and 1B.

A conductive-glass substrate (coated with F-doped $SnO_2$, 10 Ω/square) was prepared for use. This substrate was set as the working electrode and was immersed in an aqueous electrolytic solution in which 0.01 mol/L of zinc nitrate and 0.01 mol/L of potassium chloride were mingled, and this electrolytic solution was heated to 90° C. Then, a potential of −1.2 V was applied for 20,000 seconds to effect electrodeposition.

After the electrodeposition, the conductive-glass substrate was observed to find that zinc oxide acicular crystals constituting the semiconductor acicular-crystal layer 17 had grown on the conductive-glass substrate surface in the direction vertical thereto as shown in FIG. 1B. The zinc oxide acicular crystals were from 150 nm to 250 nm in diameter and from 8 $\mu$m to 10 $\mu$m in length.

The light absorption layer 16 was also formed using a dye. Stated specifically, a commercially available Eosin Y (available from Wako Pure Chemical Industries, Ltd.) was used. The dye was dissolved in distilled ethanol, and in the resultant solution the conductive-glass substrate having the zinc oxide acicular crystals formed thereon was immersed for 24 hours to make the zinc oxide acicular crystals adsorb the dye, followed by drying at a temperature of about 80° C.

Then, as the substrate 13 with electrode, a conductive-glass substrate (coated with F-doped $SnO_2$, 10 Ω/square) on which graphite was deposited by sputtering in a thickness of 10 nm was used. The charge transport layer 12 was formed using a p-type semiconductor CuI. The CuI was dissolved in anhydrous acetonitrile, and then made to deposit at the film interface of the dye-supported zinc oxide acicular crystals. Thus, the substrate 13 with electrode, to be provided opposingly to the solid charge transport layer 12, was put together thereon to set up a photoelectric conversion device (cell).

As a comparative example, a cell was set up by the same production steps as the above except that ZnO powder composed chiefly of particles of 100 nm in diameter and having been heat-treated was used to form ZnO particle crystals. Then, on the side of the substrate 10 with electrode, the cell of this Example and the comparative example each was irradiated by light of a 500 W xenon lamp fitted with an ultraviolet-screening filter. Then, the value of photoelectric current generated by photoelectric conversion reaction having taken place here was measured.

As a result of measurement, the cell of this Example was found to have been improved in both the value of short-circuit current and the value of open-circuit voltage by about 5% compared with the comparative example. This is considered due to the fact that the use of the zinc oxide acicular crystals has lessened the internal resistance of the electron acceptor type charge transport layer.

Example 12

In this Example, an instance in which an acicular zinc oxide electrode is produced by electrodeposition and is used in a photoelectric conversion device is described with reference to FIGS. 1A and 1B.

A conductive-glass substrate (coated with F-doped $SnO_2$, 10 Ω/square) was prepared for use. This substrate was set as the working electrode and was immersed in an aqueous electrolytic solution in which 0.01 mol/L of zinc nitrate and 0.2 g/L of polyvinyl alcohol (degree of polymerization: 1,400) were mingled, and this electrolytic solution was heated to 90° C. Then, a potential of −1.2 V was applied for 20,000 seconds to effect electrodeposition.

After the electrodeposition, the conductive-glass substrate was observed to find that zinc oxide acicular crystals constituting the semiconductor acicular-crystal layer 17 had grown on the conductive-glass substrate surface in the direction vertical thereto as shown in FIG. 1B. The zinc oxide acicular crystals were from 200 nm to 250 nm in diameter and from 10 μm to 12 μm in length.

The light absorption layer 16 was also formed using a dye. Stated specifically, a commercially available mercurochrome (available from Aldrich Chemical Co., Inc.) was used. The dye was dissolved in distilled ethanol, and in the resultant solution the conductive-glass substrate having the zinc oxide acicular crystals formed thereon was immersed for 24 hours to make the zinc oxide acicular crystals adsorb the dye, followed by drying at a temperature of about 80° C.

The charge transport layer 12 was also formed using a $I^-/I_3^-$ redox pair. As the electrolyte, 0.05 mol/L of $I_2$ (iodine), 0.1 mol/L of LiI (lithium iodide), 0.6 mol/L of DMPI (Im) (1,2-dimethyl-3-propylimidazolium iodide) and 0.5 mol/L of TBP (4-tert-butylpyridine) were used. As the solvent, MAN (MeOAN) (methoxyacetonitrile) was used. This mixed solution was dropped on the conductive-glass substrate having the zinc oxide acicular crystals formed thereon, and thereafter the substrate 13 with electrode was put together thereon to set up a cell. As the substrate 13 with electrode, a conductive-glass substrate on which platinum was deposited by sputtering in a thickness of 10 nm was used.

As a comparative example, a cell was set up by the same production steps as the above except that ZnO powder composed chiefly of particles of 100 nm in diameter and having been heat-treated was used to form ZnO particle crystals. Then, on the side of the substrate 10 with electrode, the cell of this Example and the comparative example each was irradiated by light of a 500 W xenon lamp fitted with an ultraviolet-screening filter. Then, the value of photoelectric current generated by photoelectric conversion reaction having taken place here was measured.

As a result of measurement, the cell of this Example was found to have been improved in both the value of short-circuit current and the value of open-circuit voltage by about 10% compared with the comparative example. This is considered due to the fact that the use of the zinc oxide acicular crystals has lessened the internal resistance of the electron acceptor type charge transport layer.

Example 13

In this Example, an instance in which zinc oxide acicular crystals are produced by electrodeposition in an aqueous zinc nitrate solution to which a quaternary ammonium salt has been added as a surface-active agent (cosolute) is described.

First, to an aqueous 2 mmol/L zinc nitrate solution, 4 mmol/L of n-dodecyltrimethylammonium chloride was added as a cosolute to prepare an electrolytic solution, which was then heated to 85° C. Next, a conductive-glass substrate (coated with F-doped $SnO_2$, 10 Ω/square) was prepared for use as the working electrode and was immersed in the above electrolytic solution. Then, a potential of −1.2 V was applied for 20,000 seconds to effect electrodeposition. Thereafter, the resultant substrate having zinc oxide acicular crystals thus grown thereon was placed in a tubular electric furnace to make heat treatment for 1 hour at 500° C. while flowing oxygen at a rate of $1.67 \times 10^{-3}$ L/s.

As a comparative example, electrodeposition was also carried out for 20,000 seconds under application of a potential of −1.2 V, using an aqueous 2 mmol/L zinc nitrate solution containing no cosolute.

As the result, the zinc oxide acicular crystals of the present invention were found to have a smaller diameter and a larger length and accordingly have an aspect ratio which was higher by about 20%. This is considered due to the fact that the action of the cosolute surface-active agent has made crystals grow predominantly in the direction vertical to the substrate.

Example 14

In this Example, an instance in which zinc oxide acicular crystals are produced by electrodeposition in an aqueous zinc nitrate solution to which a quaternary ammonium salt has been added as a surface-active agent (cosolute) is described.

To an aqueous 2 mmol/L zinc nitrate solution, 4 mmol/L of n-tetradecyltrimethylammonium chloride was added as a cosolute to prepare an electrolytic solution, which was then heated to 85° C. Next, a conductive-glass substrate (coated with F-doped $SnO_2$, 10 Ω/square) was prepared for use as the working electrode and was immersed in the above electrolytic solution. Then, a potential of −1.2 V was applied to effect electrodeposition for 20,000 seconds. Thereafter, the resultant substrate having zinc oxide acicular crystals thus grown thereon was placed in a tubular electric furnace to make heat treatment for 1 hour at 500° C. while flowing oxygen at a rate of $1.67 \times 10^{-3}$ L/s.

As a comparative example, electrodeposition was also carried out for 20,000 seconds under application of a potential of −1.2 V, using an aqueous 2 mmol/L zinc nitrate solution containing no cosolute.

Because of the addition of the surface-active agent, the zinc oxide acicular crystals of the present invention had a diameter which was smaller by about 3% and an aspect ratio which was higher by about 5%, than the comparative example.

Example 15

In this Example, an instance in which zinc oxide acicular crystals are produced by electrodeposition in aqueous zinc nitrate solutions to which primary to tertiary amine salt cationic surface-active agents have been added as the cosolutes is described.

To an aqueous 2 mmol/L zinc nitrate solution, monooctylammonium chloride (primary amine salt), octylmethylammonium chloride (secondary amine salt) and octyldimethylammonium chloride (tertiary amine salt) were each added as a cosolute to prepare three electrolytic solutions, which were then heated to 85° C. (Hereinafter, these chlorides are depicted as primary amine salt, secondary amine salt and tertiary amine salt, respectively.) All of these amine salts were each added in an amount of 2 mmol/L. Next, a conductive-glass substrate (coated with F-doped $SnO_2$, 10 Ω/square) was prepared for use as the working electrode and was immersed in each of the above electrolytic solutions. Then, a potential of −1.2 V was applied to effect electrodeposition for 20,000 seconds. Thereafter, the resultant substrates having zinc oxide acicular crystals thus grown thereon were placed in a tubular electric furnace to make heat treatment for 1 hour at 500° C. while flowing oxygen at a rate of $1.67 \times 10^{-3}$ L/s.

As a comparative example, electrodeposition was also carried out for 20,000 seconds under application of a potential of −1.2 V, using an aqueous 2 mmol/L zinc nitrate solution containing no cosolute.

As the result, the zinc oxide acicular crystals produced in the aqueous zinc nitrate solutions to which the primary amine salt, secondary amine salt and tertiary amine salt were respectively added all showed the effect of having a smaller diameter and a higher aspect ratio. The zinc oxide acicular crystals produced in the aqueous zinc nitrate solutions produced using the primary amine salt, secondary amine salt and tertiary amine salt cosolutes had diameters which were smaller by about 8%, about 7% and about 5%, respectively, and aspect ratios which were all higher by about 10%, than the comparative example.

Example 16

In this Example, an instance in which zinc oxide acicular crystals are produced by electrodeposition in an aqueous zinc nitrate solution to which a nonionic surface-active agent has been added as the cosolute is described.

To an aqueous 2 mmol/L zinc nitrate solution making use of acetonitrile as an electrolytic solvent, 4 mmol/L of TRITON X-100 was added as a cosolute to prepare an electrolytic solution, which was then heated to 70° C. Next, a conductive-glass substrate (coated with F-doped $SnO_2$, 10 $\Omega$/square) was prepared for use as the working electrode and was immersed in the above electrolytic solution. Then, a potential of −1.2 V was applied to effect electrodeposition for 20,000 seconds. Thereafter, the resultant substrate having zinc oxide acicular crystals thus grown thereon was placed in a tubular electric furnace to make heat treatment for 1 hour at 500° C. while flowing oxygen at a rate of $1.67 \times 10^{-3}$ L/s.

As a comparative example, electrodeposition was also carried out for 20,000 seconds under application of a potential of −1.2 V, using an aqueous 2 mmol/L zinc nitrate solution making use of acetonitrile but containing no cosolute.

As the result, the zinc oxide acicular crystals of the present invention had a diameter which was smaller by about 3% and an aspect ratio which was higher by about 6%, than the comparative example.

Example 17

In this Example, an instance in which zinc oxide acicular crystals are produced by electrodeposition in an aqueous zinc nitrate solution to which an anionic surface-active agent has been added as the cosolute is described.

To an aqueous 2 mmol/L zinc nitrate solution, 4 mmol/L of sodium n-dodecylbenzenesulfonate was added as a cosolute to prepare an electrolytic solution, which was then heated to 85° C. Next, a conductive-glass substrate (coated with F-doped $SnO_2$, 10 $\Omega$/square) was prepared for use as the working electrode and was immersed in the above electrolytic solution. Then, a potential of −1.2 V was applied to effect electrodeposition for 20,000 seconds. Thereafter, the resultant substrate having zinc oxide acicular crystals thus grown thereon was placed in a tubular electric furnace to make heat treatment for 1 hour at 500° C. while flowing oxygen at a rate of $1.67 \times 10^{-3}$ L/s.

As a comparative example, electrodeposition was also carried out for 20,000 seconds under application of a potential of −1.2 V, using an aqueous 2 mmol/L zinc nitrate solution containing no cosolute.

As the result, the zinc oxide acicular crystals of the present invention had a diameter which was smaller by about 3% and an aspect ratio which was higher by about 4%, than the comparative example.

Example 18

In this Example, an instance in which zinc oxide acicular crystals are produced by electrodeposition in an aqueous zinc nitrate solution to which an amphoteric surface-active agent has been added as the cosolute is described.

To an aqueous 2 mmol/L zinc nitrate solution, 4 mmol/L of betaine lauryldimethylaminoacetate was added as a cosolute to prepare an electrolytic solution, which was then heated to 85° C. Next, a conductive-glass substrate (coated with F-doped $SnO_2$, 10 $\Omega$/square) was prepared for use as the working electrode and was immersed in the above electrolytic solution. Then, a potential of −1.2 V was applied to effect electrodeposition for 20,000 seconds. Thereafter, the resultant substrate having zinc oxide acicular crystals thus grown thereon was placed in a tubular electric furnace to make heat treatment for 1 hour at 500° C. while flowing oxygen at a rate of $1.67 \times 10^{-3}$ L/s.

As a comparative example, electrodeposition was also carried out for 20,000 seconds under application of a potential of −1.2 V, using an aqueous 2 mmol/L zinc nitrate solution containing no cosolute.

As the result, the zinc oxide acicular crystals of the present invention had a diameter which was smaller by about 4% and an aspect ratio which was higher by about 5%, than the comparative example.

Example 19

An instance is described in which a photoelectric conversion device is produced using the zinc oxide acicular crystals produced in Example 13 which are formed as an n-type charge transport layer.

The zinc oxide acicular crystals produced in the aqueous 2 mmol/L zinc nitrate solution to which 4 mmol/L of n-dodecyltrimethylammonium chloride was added were employed, and were used in an n-type charge transport layer of a photoelectric conversion device. Next, as a dye, commercially available Eosin Y was used. The dye was dissolved in distilled ethanol, and in the resultant solution an electrode with the zinc oxide acicular crystals was immersed for 24 hours to make the electrode adsorb the dye, followed by drying at 80° C. to form a light absorption layer. Also, a conductive-glass substrate (coated with F-doped $SnO_2$, 10 $\Omega$/square) on which platinum was deposited by sputtering in a thickness of 10 nm was used as an counter electrode. $I^-/I_3^-$ was used as a redox pair. As the electrolyte, 0.46 mol/L of tetrapropylammonium iodide and 0.06 mol/L of iodine were used, and as the solvent a mixed solvent of 80 vol. % of ethylene carbonate and 20 vol. % of acetonitrile was used. This mixed solvent was dropped on the electrode on the side of the n-type charge transport layer, which was then interposed with the counter electrode to set up a cell.

As a comparative example, a cell was set up in the same manner but using zinc oxide acicular crystals produced without use of any cosolute.

Then, on the side of the counter electrode, the cell of this Example and the comparative example each was irradiated by light of a 500 W xenon lamp fitted with an ultraviolet-screening filter. The value of photoelectric current generated by photoelectric conversion reaction having taken place here was measured. As the result, the cell of the present invention was found to have a photoelectric conversion efficiency which was higher by about 10% than the comparative example.

As described above, according to the present invention, zinc oxide acicular structures can be formed on substrates.

What is claimed is:

1. A process for producing a zinc oxide acicular structure comprising the steps of:
    holding a substrate in en electrolytic solution; and
    forming zinc oxide on the substrate by electrodeposition,
    wherein the electrolytic solution comprises zinc ions and at least one cosolute, which said cosolute comprises:
        (i) an organic solvent selected from the group consisting of an alcohol, a lower alcohol, ethanol, a higher alcohol or hexanol;
        (ii) a monomer or a polymer from the monomer, which has a vinyl group; or
        (iii) a surface-active agent.

2. The process according to claim 1, wherein the organic solvent is in a concentration of 10% or less as volume ratio to the electrolytic solvent.

3. The process according to claim 1, wherein the polymer is a water-soluble polymer.

4. The process according to claim 1, wherein the polymer is polyvinyl alcohol or polyethylene glycol.

5. The process according to claim 1, wherein the monomer or the polymer is in a concentration ranging from 0.01 g/L to 100 g/L.

6. The process according to claim 1, wherein the surface-active agent is a cationic surface active agent.

7. The process according claim 6, wherein the cationic surface-active agent is a quaternary ammonium salt.

8. The process according to claim 7, wherein the quaternary ammonium salt is represented by the following chemical formula:

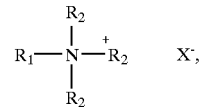

wherein $R_1$ is a long-chain alkyl group having 13 or less carbon atoms, $R_2$ is a methyl group or an ethyl group, and $X^-$ is an anion.

9. The process according to claim 1, wherein the surface-active agent is added in an amount of from 1 mmol/L to 0.1 mol/L.

* * * * *

UNITED STATES PATENT AND TRADEMARK OFFICE
CERTIFICATE OF CORRECTION

PATENT NO. : 6,860,982 B2
DATED : March 1, 2005
INVENTOR(S) : Hiroshi Okura et al.

It is certified that error appears in the above-identified patent and that said Letters Patent is hereby corrected as shown below:

Title page,
Item [56], References Cited, OTHER PUBLICLATIONS, after "Minoru Satoh:" reference, "L586-589" should read -- L586-L589 --; and after "M.K. Nazeeruddin:" reference, "SCN)" should read -- $SCN^-$) --.

Column 23,
Line 4, "en" should read -- an --.

Signed and Sealed this

Sixteenth Day of August, 2005

JON W. DUDAS
*Director of the United States Patent and Trademark Office*